United States Patent
Wong (10) Patent No.: US 6,662,263 B1
(45) Date of Patent: Dec. 9, 2003

(54) SECTORLESS FLASH MEMORY ARCHITECTURE

(75) Inventor: Sau C. Wong, Hillsborough, CA (US)

(73) Assignee: Multi Level Memory Technology, San Jose, CA (US)

( * ) Notice: Subject to any disclaimer, the term of this patent is extended or adjusted under 35 U.S.C. 154(b) by 0 days.

(21) Appl. No.: 09/518,608

(22) Filed: Mar. 3, 2000

(51) Int. Cl.⁷ .............................................. G06F 12/00
(52) U.S. Cl. .................. 711/103; 711/165; 365/185.11; 365/185.13; 365/185.29; 365/185.33; 365/189.04; 365/230.03; 365/230.06
(58) Field of Search ................................ 711/103, 154, 711/161, 165; 365/185.13, 185.29, 185.33, 230.03, 230.06, 189.04, 185.11

(56) References Cited

U.S. PATENT DOCUMENTS

| | | | |
|---|---|---|---|
| 4,558,431 A | 12/1985 | Satoh | |
| 4,964,079 A | 10/1990 | Devin | |
| 5,031,147 A | 7/1991 | Maruyama et al. | |
| 5,043,940 A | 8/1991 | Harari | |
| 5,095,344 A | 3/1992 | Harari | |
| 5,172,338 A | 12/1992 | Mehrotra et al. | |
| 5,239,505 A | 8/1993 | Fazio et al. | |
| 5,249,158 A | 9/1993 | Kynett et al. | |
| 5,293,560 A | 3/1994 | Harari | |
| 5,293,563 A | 3/1994 | Ohta | |
| 5,303,198 A | * 4/1994 | Adachi et al. | 365/185.11 |
| 5,343,063 A | 8/1994 | Yuan et al. | |
| 5,371,702 A | 12/1994 | Nakai et al. | |
| 5,379,413 A | * 1/1995 | Hazen et al. | 714/719 |
| 5,399,891 A | 3/1995 | Yiu et al. | |
| 5,418,752 A | 5/1995 | Harari et al. | |
| 5,526,307 A | 6/1996 | Yiu et al. | |
| 5,583,812 A | 12/1996 | Harari | |
| 5,592,669 A | 1/1997 | Robinson et al. | |
| 5,638,320 A | 6/1997 | Wong et al. | |
| 5,642,312 A | 6/1997 | Harari | |
| 5,680,341 A | 10/1997 | Wong et al. | |
| 5,682,497 A | 10/1997 | Robinson | |
| 5,691,938 A | 11/1997 | Yiu et al. | |
| 5,694,357 A | 12/1997 | Mori | |
| 5,712,740 A | 1/1998 | Kikuchi et al. | |
| 5,717,632 A | 2/1998 | Richart et al. | |
| 5,717,636 A | * 2/1998 | Dallabora et al. | 365/185.13 |
| 5,742,934 A | 4/1998 | Shinohara | |
| 5,745,409 A | 4/1998 | Wong et al. | |
| 5,748,528 A | 5/1998 | Campardo et al. | |
| 5,751,634 A | 5/1998 | Itoh | |
| 5,768,192 A | 6/1998 | Eitan | |
| 5,781,921 A | * 7/1998 | Nichols | 711/115 |
| 5,801,994 A | 9/1998 | Chang et al. | |

(List continued on next page.)

Primary Examiner—Mano Padmanabhan
Assistant Examiner—Jasmine Song
(74) Attorney, Agent, or Firm—David T. Millers (57) ABSTRACT

A non-volatile, multi-bit-per-cell, Flash memory uses a storage process and/or architecture that is not sector-based. A data block can be stored without unused storage cells remaining in the last sector that stores part of the data block. For an operation erasing one or more data blocks, data blocks to be saved are read from an array and stored temporarily in a storage device. The entire array is then erased; after which the saved data blocks are rewritten in the memory with the amount of storage originally allocated to the erased data now being available for new data. This data arrangement does not subject any memory cells to a large accumulated cell disturbance because all data is read from the array and freshly re-written back into the array every time a record operation occurs. Additionally, the separate sectors in the memory device do not have different endurance histories that must be accounted for to extend the life of the memory. A single erase count for an array can be used in selection of operating parameters such as voltages used during accesses of memory cells in the array.

20 Claims, 6 Drawing Sheets

U.S. PATENT DOCUMENTS

| | | | |
|---|---|---|---|
| 5,802,553 A | | 9/1998 | Robinson et al. |
| 5,822,781 A | | 10/1998 | Wells et al. |
| 5,848,019 A | * | 12/1998 | Matthews et al. ..... 365/230.06 |
| 5,880,993 A | | 3/1999 | Kramer et al. |
| 5,886,923 A | * | 3/1999 | Hung .................... 365/185.11 |
| 5,892,715 A | * | 4/1999 | Hirata et al. ........... 365/185.29 |
| 5,896,340 A | | 4/1999 | Wong et al. |
| 5,896,393 A | * | 4/1999 | Yard et al. .................. 714/710 |
| 5,905,993 A | | 5/1999 | Shinohara |
| 5,909,387 A | | 6/1999 | Wong et al. |
| 5,909,390 A | | 6/1999 | Harari |
| 5,909,449 A | | 6/1999 | So et al. |
| 5,936,887 A | | 8/1999 | Choi et al. |
| 5,946,714 A | | 8/1999 | Miyauchi |
| 5,962,890 A | | 10/1999 | Sato |
| 5,963,465 A | | 10/1999 | Eitan |
| 5,970,012 A | | 10/1999 | Takeshima |
| 5,973,958 A | | 10/1999 | Parker |
| 5,987,478 A | | 11/1999 | See et al. |
| 5,999,445 A | | 12/1999 | Rolandi et al. |
| 5,999,446 A | | 12/1999 | Harari et al. |
| 6,002,614 A | | 12/1999 | Banks |
| 6,005,803 A | | 12/1999 | Kuo et al. |
| 6,038,636 A | * | 3/2000 | Brown, III et al. ......... 711/103 |
| 6,055,181 A | | 4/2000 | Tanaka et al. |
| 6,088,264 A | | 7/2000 | Hazen et al. |
| 6,091,633 A | | 7/2000 | Cernea et al. |
| 6,097,637 A | | 8/2000 | Bauer et al. |
| 6,122,193 A | | 9/2000 | Shibata et al. |
| 6,130,841 A | | 10/2000 | Tanaka et al. |
| 6,134,145 A | | 10/2000 | Wong |
| 6,137,719 A | | 10/2000 | Tsuruda et al. |
| 6,149,316 A | | 11/2000 | Harari et al. |
| 6,151,246 A | * | 11/2000 | So et al. ................ 365/185.09 |
| 6,166,407 A | | 12/2000 | Ohta |
| 6,166,959 A | | 12/2000 | Gupta et al. |
| 6,181,597 B1 | | 1/2001 | Nachumovsky |
| 6,198,648 B1 | | 3/2001 | Komatsu |
| 6,212,121 B1 | | 4/2001 | Ryu et al. |
| 6,229,734 B1 | | 5/2001 | Watanabe |
| 6,232,632 B1 | | 5/2001 | Liu |
| 6,240,032 B1 | | 5/2001 | Fukumoto |
| 6,256,231 B1 | | 7/2001 | Lavi et al. |
| 6,259,627 B1 | | 7/2001 | Wong |
| 6,285,574 B1 | | 9/2001 | Eitan |
| 6,292,392 B1 | | 9/2001 | Fukui |
| 6,301,154 B1 | | 10/2001 | Sumitani |
| 6,317,363 B1 | | 11/2001 | Guterman et al. |
| 6,330,185 B1 | | 12/2001 | Wong et al. |

* cited by examiner

SECTORLESS FLASH MEMORY ARCHITECTURE

BACKGROUND

1. Field of the Invention

This invention relates to non-volatile memory and to systems for storage of blocks of information.

2. Description of Related Art

Figure 1A:
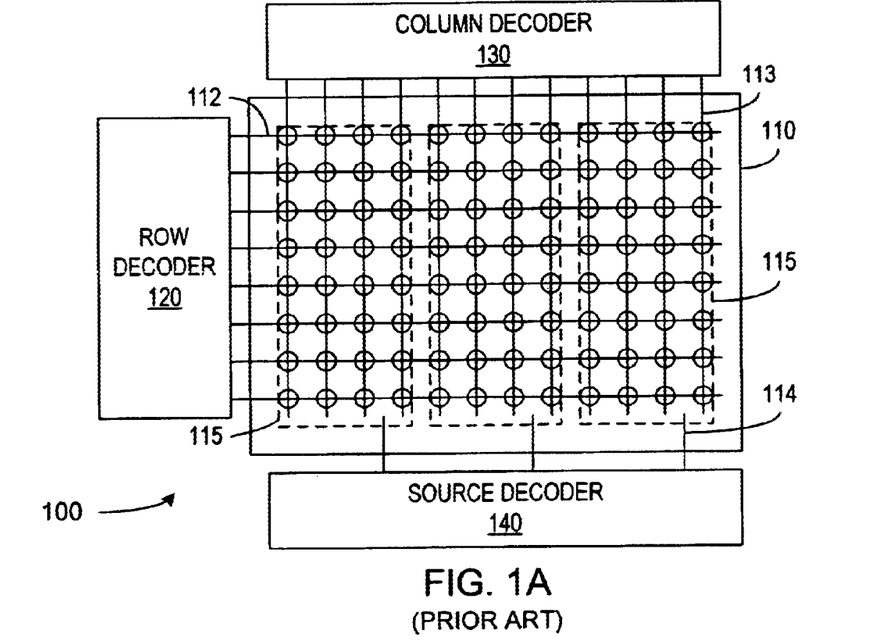
FIGS. 1A and 1B are block diagrams of standard architectures for Flash memories.

A conventional non-volatile semiconductor memory such as a Flash memory includes one or more arrays of memory cells. FIG. 1A shows a conventional architecture for a Flash memory 100 including an array 110. The memory cells in array 110 are arranged in rows and columns and connected together by row lines 112 and column lines 113 (also referred to as word lines 112 and bit lines 113). Each row line 112 connects to the control gates of memory cells in an associated row, and each column line 113 connects to the drains of memory cells in an associated column. Flash memory array 110 is further divided into multiple sectors 115. Each sector 115 contains one or more columns of memory cells and has an associated source line 114 connected to the sources of the memory cells in the sector 115. Further associated with each memory array 110 are a row decoder 120, a column decoder 130, and a source decoder 140 that respectively connect to row lines 112, column lines 113, and source lines 114 of the array 110. Drivers (not shown) associated with row decoder 120, column decoder 130, and source decoder 140 bias row lines 112, column lines 113, and source lines 114 as required for erase, write, and read operations.

Figure 1B:
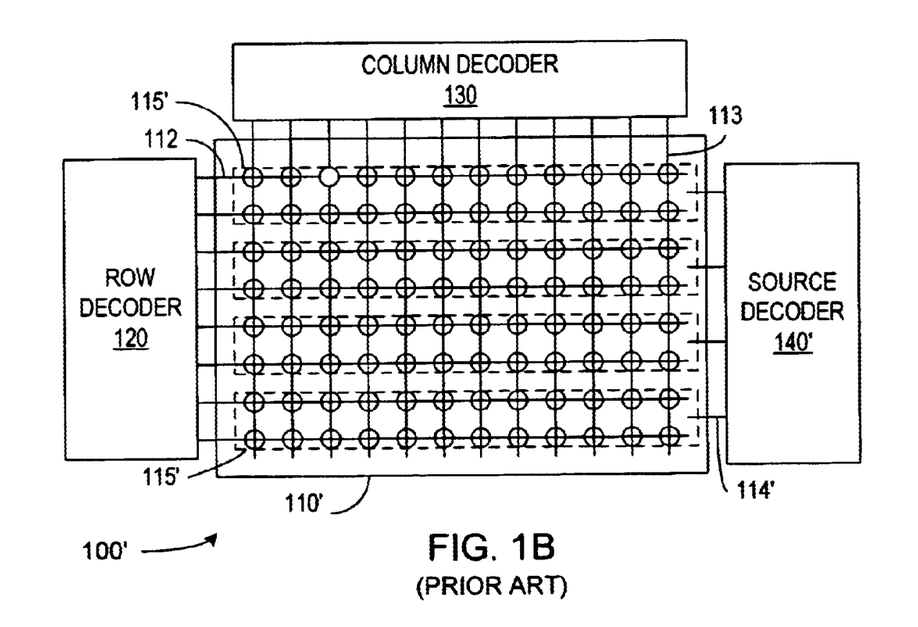

FIG. 1B shows another architecture for a Flash memory array 110'. Array 110 ' is similar to array 110 (FIG. 1A) but has row-based sectors 115', instead of column based sectors. Each sector 115' includes one or more rows of memory cell a source line 114' connected to the sources of the memory cells in the sector 115'. A source decoder 140' connects to and controls the voltage levels on source lines 114' for erase, write, and read operations.

The memory arrays 110 and 110' commonly store blocks of data. For example, a digitally encoded music player such as an MP3 music player can employ array 110 or 110' to store data representing music or songs. The data for each song is stored in one or more sectors 115 or 115', and each sector 115 or 115' only stores data from one song. This arrangement permits a user to erase one song by erasing the sector or sectors associated with the song. The data associated with other songs, being stored in separate sectors, is not erased. A user can thus keep a favorite song while changing other songs. One drawback of this data arrangement is the wasted storage capacity resulting when data for a song only partly fills a sector so that some memory cells store no data. Sectors can be made smaller to reduce the average amount of wasted data storage. But, smaller sectors require a Flash memory to include more sectors for the same amount of storage, and the increase in the number of sectors increases circuit overhead. Accordingly, providing the greatest possible effective storage capacity per integrated circuit area requires balancing wasted memory cells in large sectors against increased overhead for small sectors.

Another concern or drawback of the conventional Flash memory architectures is the accumulation of disturbances of the threshold voltages of memory cells. With either array 110 or 110', row decoder 120 and column decoder 130 respectively apply signals to a selected row line and a selected column line to write to or read from a selected memory cell. For a write operation, the voltages on the selected row and column lines are high and combine to change the threshold voltage of the selected memory cell, thereby writing a data value. The high row and column voltages can disturb the threshold voltages of unselected memory cells connected to the selected row line or the selected column line. These disturbances of the threshold voltages (i.e., write disturbs) can accumulate over time.

For an erase operation, source decoder 140 or 140' and row decoder 120 establish in a selected sector a voltage difference between the control gates and the sources of the memory cells while the drains float. The voltage difference causes Fowler-Nordheim tunneling that lowers the threshold voltages of the memory cells in the selected sector, to an erased state. Typically, the source decoder applies a positive voltage to the source line 114 or 114' for a selected sector, and row decoder 120 applies ground or a negative voltage to the row lines associated with the selected sector. For array 110, row lines 112 connect to memory cells in sectors 115 not being erased. Accordingly, erasing the selected sector can disturb the threshold voltages of memory cells in other sectors of the array 110. These disturbances of the threshold voltages (i.e., erase disturbs) can accumulate over time.

Particular problems arise if data remains in some sectors while other sectors of the array are repeatedly erased and programmed. In this case, the accumulated write and erase disturb can change the threshold voltages of memory cells in sectors storing long term data. Such disturbance can become intolerable in a multi-bit-per-cell memory. In a multi-bit-per-cell memory, each memory cell stores N bits of information and requires $2^N$ distinguishable threshold voltage windows corresponding to the possible N-bit values. As N increases, the threshold voltage windows narrow, and the disturbance of the threshold voltages becomes more difficult to accommodate.

Another problem arises because the memory cells in sectors that are erased frequently age differently from memory cells in sectors that are rarely erased. To compensate for aging or endurance effects, a memory can include circuits that adjust erase, write, or read voltages to compensate for the effects of aging. Different types of compensation can be required for different sectors because the memory cells in different sectors have different histories and have aged differently. Some memories incorporate complex circuitry that monitors the number of erase operations for each sector and operates each sector according to its history. U.S. Pat. Nos. 5,172,338 and 5,163,021, entitled "Multi-State EEPROM Read and Write Circuits and Techniques", describe Flash memory including circuitry that compensates for differences in aging in different sectors. Such circuitry requires extra overhead, increases circuit complexity, and therefore can increase the cost of a Flash memory.

SUMMARY

In accordance with the invention, a non-volatile memory uses a data management process or arrangement that is not sector-based. This improves storage efficiency because data blocks can be stored without unused storage cells between data blocks. To erase one or more data block from an array, data blocks from the array that are to be saved are read and stored temporarily in a storage device, such as a main memory or a hard disk drive of a computer system connected to the non-volatile memory. The entire memory array is then erased, and the data blocks from the storage device are rewritten in the memory, with the amount of storage originally allocated to the erased data blocks now being available for new data blocks. This data arrangement does not subject any memory cells to a large accumulated write or erase disturbances because all data is read from the array and freshly re-written back after other data blocks in the array are erased. Thus, the accumulated program disturb is limited to only that accumulated from filling the array with data at most once. Additionally, the separate sectors do not have different endurance histories that must be accounted for to extend the life of the memory. A single count of the number of erase operation performed on an array can control voltages used during erase, write, or read operation to extend the usable life of the memory.

One embodiment of the invention is a method for operating a semiconductor memory such as a multi-bit-per-cell Flash memory. The method includes: storing portions of a plurality of data blocks in an array in the memory; selecting one or more of the data blocks for erasure; reading from the array data from data blocks that are not selected for erasure; erasing the array; and writing into the memory the data read from the array. The data that were read from the array can be stored while erasing the array so that writing into the memory writes at least a portion of the data blocks back into the erased array. The array can be sectorless for simultaneously erasing all memory cells in the array or can be partitioned into separately erasable sectors that are erased in a sequential, parallel, or pipelined manner. To maximize storage utilization, the data blocks are written at consecutive addresses in the array, without regard for boundaries between sectors.

Another embodiment of the invention is a system for storage of data blocks. The system includes a first memory that is a non-volatile semiconductor memory such as a multi-bit-per-cell Flash memory and a computer system connected to the first memory. The computer system can be a personal computer that includes a storage device such as a disk drive and a processor that executes file management procedure. Executing the file management procedure includes: identifying a plurality of data blocks at least partially stored in an array in the first memory; selecting one or more of the data blocks for erasure; reading from the array data from data blocks that are not selected for erasure; storing in the storage device the data read from the array; erasing the array; and writing into the first memory the data from the storage device. In an example application, the data blocks represent music, and the first memory is the memory of a portable player of digitally-encoded music. The file management procedure can write the data from the storage device and data from new data blocks into the erased array. When writing, the data blocks are stored at consecutive physical addresses in the array, without regard for boundaries between sectors.

Yet another embodiment of the invention is a non-volatile memory that includes arrays of memory cells, local circuits, and global circuits. Each array includes row lines, column lines, and a source line, wherein the row lines, the column lines, and the source line of each array are isolated from the row lines, the column lines, and the source line of the other arrays. Each local circuit is associated with and coupled to a corresponding one of the arrays. The local circuits implement erase, write, and read operations in the corresponding array, wherein the erase operation erases all memory cells in the corresponding array. Each local circuit can maintain a single count of the number of erasures of the associated array and can use the count to select voltages used during erase, write, or read operations.

The global circuits connect to and coordinate the local circuits for input and output of data from the memory. To achieve a high bandwidth, the global circuits coordinate the local circuit to simultaneously write a plurality of multi-bit values in a plurality of the arrays and/or coordinate the local circuit to simultaneously read a plurality of multi-bit values from a plurality of the arrays.

BRIEF DESCRIPTION OF THE DRAWINGS

Use of the same reference symbols in different figures indicates similar or identical items.

DETAILED DESCRIPTION

In accordance with an aspect of the invention, a storage system employing non-volatile Flash memory, erases an entire array instead of individual sectors, and writes back into the memory any data to be retained after the erase. This avoids the possible large accumulated threshold voltage disturbances that are difficult to accommodate in a multi-bit-per-cell memory. The system also maintains a more uniform endurance history for memory cells in the array. Accordingly, the memory can provide higher storage density by permitting smaller margins for threshold voltage disturbances and disparities in aging effects. Additionally, storing data independent of sector boundaries reduces storage inefficiency resulting from unused memory cells between the end of one data block in one sector and the start of the next data block in a following sector.

Figure 2A:
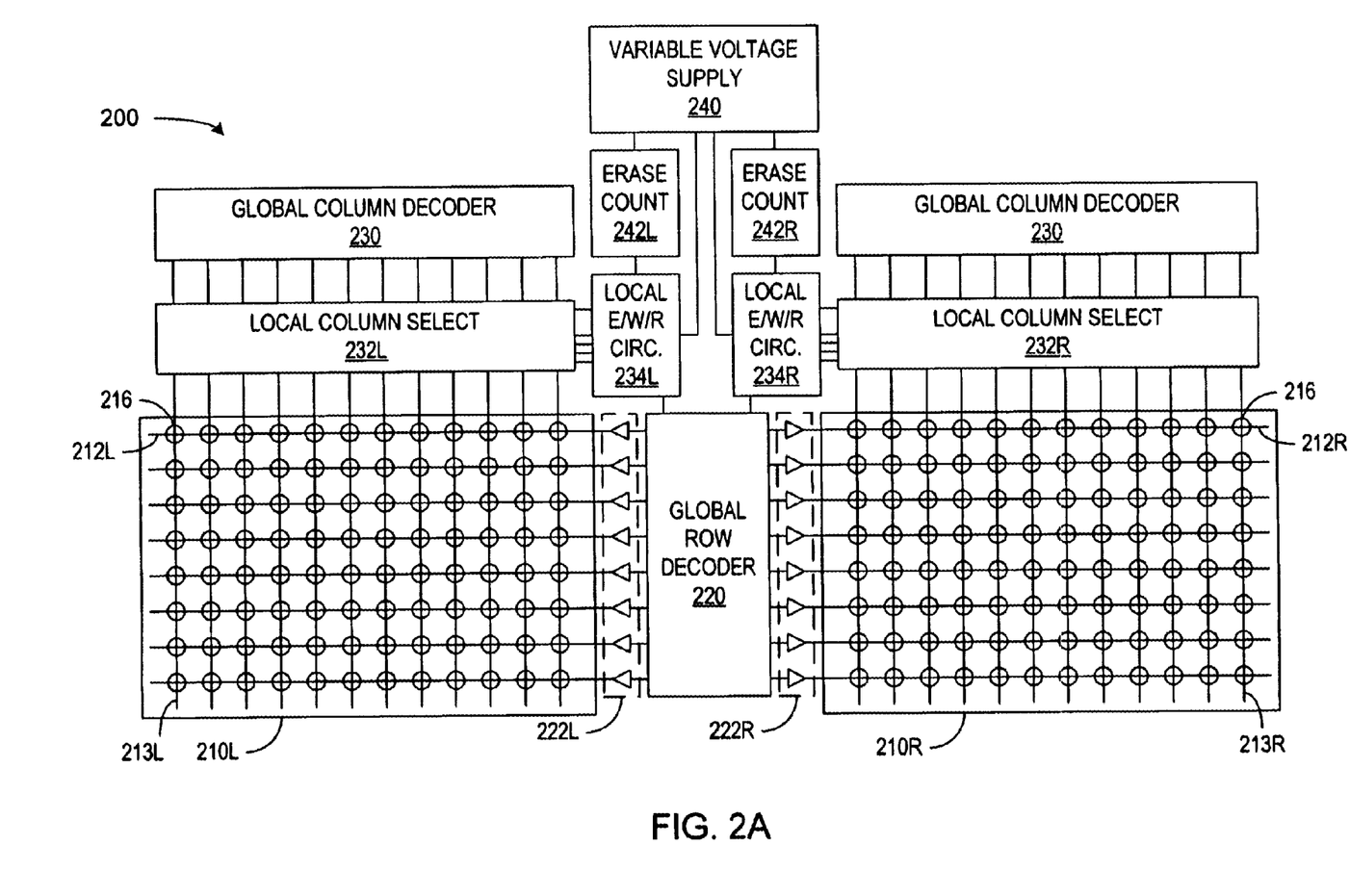
FIGS. 2A and 2B are block diagrams of embodiments of multi-bit-per-cell Flash memories in accordance with the invention.

FIG. 2A shows a multi-bit-per-cell Flash memory 200 in accordance with an embodiment of the invention. Memory 200 includes two memory arrays, a left array 210L and a right array 210R, which share a global row decoder 220. Each array 210L or 210R contains rows and columns of memory cells 216 connected together by row lines 212L or 212R and column lines 213L and 213R. In array 210L, row lines 212L connect to the control gates of memory cells in associated rows, and column lines 213L connect to the drains of memory cells in associated columns. In array 210R, row lines 212R connect to the control gates of memory cells in associated rows, and column lines 213R connect to the drains of memory cells in associated columns. Each memory cell 216 is a non-volatile memory cell and can be implemented, for example, as a floating gate transistor having a control gate coupled to an associated row line 212L or 212R and a drain coupled to an associated column line 213L or 213R.

Global row decoder 220 is between arrays 210L and 210R so that each row line 212R is isolated from the row line 212L corresponding to the same row address. Global row decoder 220 decodes a portion of an address signal to select the array 210L or 210R and the row line 212L or 212R corresponding to the address. A global column decoder 230 decodes another portion of the address signal. Arrays 210L and 210R have respective local column select circuits 232L and 232R that select a column line according to global selection signals from global column decoder 230. Local erase/write/read (E/W/R) circuits 234L and 234R and the isolation of array 210L from array 210R permit each array 210L or 210R to conduct an erase, write, or read operation without affecting the other array 210R or 210L.

In the following, reference numbers 210, 212, 213, 222, 232, and 234 (i.e., without a suffix such as "L" or "R") generically refer to an array, a row line, a column line, a driver, a local column select circuit, and an E/W/R circuit.

FIG. 2A does not show source lines or divisions of either array 210 into sectors. In one embodiment of the invention, the sources of all memory cells 216 in each array 210 are connected together, and an erase operation simultaneously erases all memory cells in an array 210. Alternatively, if the erase voltage drivers used during an erase operation are insufficient for erasing all of the memory cells in an array 210, each array 210 can be divided into sectors for sequential or pipelined erase operations. As described above, continuous row lines or continuous column lines, depending on whether sectors are column-based or row-based, can extend across the sector of the array. In the embodiment including sectors, the entire array is erased in a series of sector erase processes.

For an exemplary erase operation, global row decoder 220 activates all of the drivers 222 associated with the array 210 being erased. Drivers 222 activated for the erase either ground the attached row lines 212 or bias the attached row lines 212 at a negative voltage, depending on the erase method employed. The source line connected to the memory cells in the array 210 being erased is raised to a positive voltage so that the total voltage difference between the control gates and the sources of the memory cells being erased is between about 10 volts and about 15 volts. The voltage difference or another parameter of the erase operation (e.g., the duration of the erase operation) can be selected according to an erase count 242 that indicates the number times the array was previously erased. The local column select circuit 232 for the array 210 being erased disconnects the associated column lines 213 from any bias voltage, thereby allowing column lines 213 to float during the erase operation. The voltage difference between the control gate and the source of each memory cell being erased causes Fowler-Nordheim tunneling that lowers the threshold voltage of the memory cell to an erased state. While one array 210L or 210R is being erased, the other array 210R or 210L can be independently accessed since there is no continuity between the row, column, or source lines of the separate arrays.

Endurance cycle counters 242L and 242R are incremented every time an erase (or write) operation occurs for corresponding arrays 210L and 210R. The output or content of counters 242L and 242R can be stored in a non-volatile Flash memory that is constantly being updated. One-bit-per-cell storage can be used to ensure reliability, and a portion of the arrays 210L and 210R can be dedicated for this purpose. The cycle counts are read out to a register next to counter 242L and 242R upon every power-up. As described further below, the usable life of the memory 100 can be increased if local E/W/R circuits 234L and 234R use erase, write, and/or read voltages that depend on the count for corresponding arrays 210L and 210R. The overhead required for this improvement in usable life is less than required in a Flash memory in which each individual sector has to maintain an independent endurance history.

After an array 210 has been erased, a write operation can program any selected memory cell in the array, to a threshold voltage level corresponding to a multi-bit value being written. Many different methods for writing a multi-bit value to a memory cell are known and can be implemented in memory 200. The following describes one particular example of a write operation to illustrate some of the issues relevant in the memory architecture of FIG. 2A. Many alternative types of write operations and write circuits could be employed.

To write to a selected memory cell, global row decoder 220 selects and activates a driver 222 connected to a selected row line 212 that is coupled to the control gate of the selected memory cell. The other drivers 222 for the selected array 210 ground the unselected row lines 212. In an exemplary embodiment, the local write/read circuit 234 associated with the selected memory cell receives a data signal representing the multi-bit value being written and provides to the selected driver 222 a programming voltage Vpp (typically between 8 volts and 12 volts) and a verify voltage Vvfy (typically between 2 volts and 6 volts). The levels of programming voltage Vpp and verify voltage Vvfy depend on the multi-bit value being written.

During each of a series of program cycles during the write operation, the activated driver 222 applies programming voltage Vpp to the selected row line 212. The associated local write/read circuit 234 directs the local column select circuit 232 to apply a programming voltage Vw (typically 5 to 6 volts) to the column line that global column decoder 230 identifies. In one embodiment of the invention, the programming voltage Vw is from a variable voltage supply 240 and has a voltage level that depends on the erase count 242 for the array. Unselected column lines 213 in the selected array 210 are grounded, as is the source line for the selected memory cell. The combination of programming voltages Vpp and Vw on the control gate and drain of the selected memory cell causes channel hot electron injection that raises the threshold voltage of the selected memory cell.

During a series of verify cycles, which are between the program cycles during of the write operation, the activated driver 222 applies verify voltage Vvfy to the selected row line 212. The associated local write/read circuit 234 directs the local column select circuit 232 to apply a read voltage Vr (typically about 1 to 1.5 volt) to the selected column line. A sense amplifier (not shown) in the write/read circuit 234L or 234R senses the conductivity of the selected memory cell to determine whether the selected memory cell has reached the target threshold voltage. After the memory cell has reached the target threshold voltage, further program cycles are stopped and the write operation is complete.

As with the write operation, memory 200 can use many alternative methods for reading a multi-bit value from a memory cell. For illustrative purposes, one such read method is addressed. In the exemplary embodiment, the local write/read circuit 234 of the selected array 210 uses a driver 222 that global row decoder 220 activates to vary a voltage on the selected row line. While the voltage on the selected row line 212 varies, a sense amplifier senses the conductivity of the selected memory cell. The row line voltage when the selected memory cell changes conductivity indicates the threshold voltage of the selected memory cell. That row line voltage can then be converted into a multi-bit digital value, which is the result of the read operation.

In general, endurance cycling affects the operation of a conventional non-volatile Flash memory cell such as a stacked-gate cell with ONO (Oxide-Nitride-Oxide) insulator using channel-hot electron injection for writing and Fowler-Nordheim tunneling for erasing. As noted above, electrical erasure is usually done with the control gate biased to either ground or a negative-potential, and the source biased to more than 10 V or to about 5 V, respectively. This creates a large electric field across the tunnel oxide in a direction that causes electrons stored in the floating-gate to tunnel through the thin tunnel oxide to the source. However, depending on the electric field across the source-substrate junction, the source junction profile, and the doping concentration and gradient, band-to-band tunneling current can occur, which causes current to flow from the source to the substrate. This current is undesirable and can generate hot-hole injection directed towards the floating gate. Some of these holes can be trapped in the tunnel oxide. These trapped charges could cause a built-in potential field across the tunnel oxide, which degrades the tunnel oxide and adversely affects the tunneling (erase) process. In other words, as the memory cell ages, the erase time usually stretches out (or increases) if the erase voltage remains the same. This effect combined with the programming degradation as described below causes the well-known, endurance-cycle-induced Vt window closure phenomenon.

One way to achieve the same erased threshold voltage Vt without increasing the erase time is to increase the erase voltage slightly as the count of erase operations increases. Negative-gate erase is preferred over grounded-gate erase, primarily because a negative-gate erase causes less band-to-band tunneling current with a lower source-to-substrate voltage. A negative-gate erase also helps to reduce the need for a large charge-pump to supply the erase current from a greater than 10 V supply. With the negative-gate erase scheme that is commonly used today, the negative-erase voltage on the control gate can be varied as a function of endurance cycle (erase count 242). Conventional voltage regulation and voltage trimming techniques can achieve the necessary voltage variation.

Endurance cycling affects writing in a similar way. During channel-hot electron injection, some of the hot-holes generated by impact ionization near the drain junction can be injected across the oxide barrier and some could be trapped in the tunnel oxide. This slows down the channel-hot electron injection process. Ideally, charge trapping can be avoided by making certain that the memory cell being programmed is biased in a desired operating region so that the drain and gate voltages are optimal (i.e., not too high and not too low) for minimizing hot-hole injection. One way to compensate for charge trapping is to adjust and increase the drain voltage Vw gradually as erase count 242 of endurance cycle increases.

Reading may also be affected by the endurance cycling. As the memory cell ages, the charge-trapping effect can cause the Vt of the memory cell to change, which could be a concern depending on the exact read scheme used. For example, slowly ramping the row line voltage to the threshold voltage of the memory cell and then converting that analog voltage to an N-bit wide data with an A/D converter, without the use of any reference cells, can potentially cause an erroneous read-out as the device ages. This problem can be taken care of by using a read method that employs $2^N$ reference cells and a CAM for comparisons that determine the N-bit wide digital representation of the Vt read from a memory cell. U.S. Pat. No. 6,094,368, entitled "Auto-Tracking Write and Read Processes For Multi-Bit-Per-Cell Non-Volatile Memories", describes such read methods and is hereby incorporated by reference in its entirety. The concern for errors during a read, may not be as problematic as erase and write errors, since the read process requires lower voltages except for the control gate, and the read operation can use a compensation scheme, for example, using multiple reference cells and a CAM for accurate read-out.

Figure 2B:
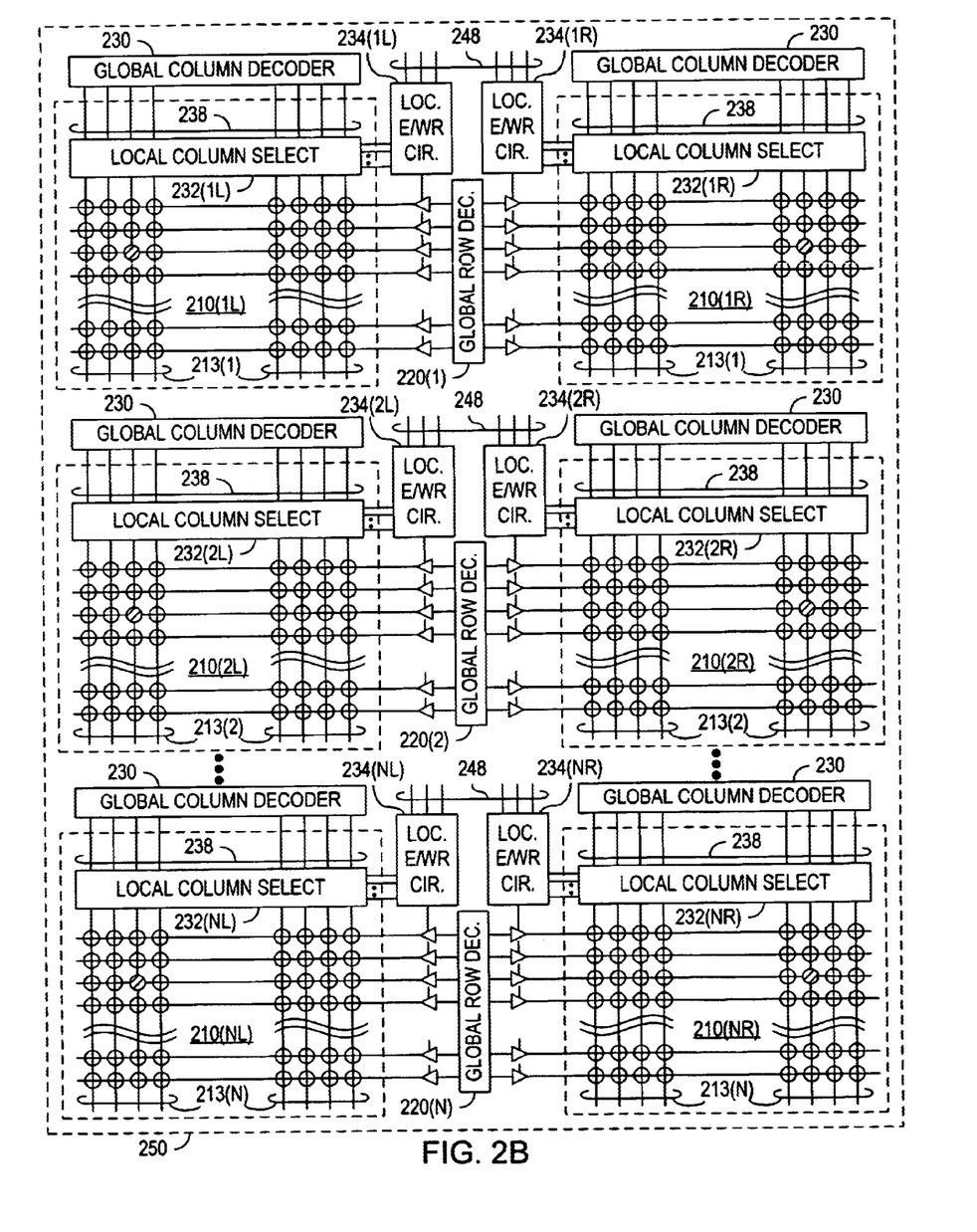

FIG. 2B is a block diagram of multi-bit-per-cell memory 250 in accordance with another embodiment of the invention. Memory 250 contains N memory banks where each bank contains left and right arrays as described above in regard to FIG. 2A. Each memory bank includes elements similar or identical to those described in regard to FIG. 2A. Those elements have the same base reference number as used in FIG. 2A but different suffixes (1L) to (NL) or (1R) to (NR) to identify the associated bank 1 to N and side left (L) or right (R).

Global I/O lines 248 connect to local E/W/R circuits 234(1L) to 234(NL) and 234(1R) to 234 (NR) for data input and output from any of the arrays 210. Global column decoder 230 connects to local column select circuits 232(1L) to 232(NL) and 232(1R) to 232(NR) via global column select lines 238, but the local column lines 213(1) to 213(N) are isolated from each other. Each array 210 has its own E/W/R circuit 234 and row and column lines 212 and 213 that are isolated from other arrays 210 to permit erase, write, or read operations that do not interfere with the operation of the other arrays. Accordingly, each of the arrays 210 can perform write or read operations in parallel. Assuming that arrays 210 are identical, performing write or read operations in parallel can increase the bandwidth of memory 250 by a factor up to 2N (where 2N is the number of independent arrays in N banks) times the bandwidth of a similar memory that writes to or reads from one memory array at a time. The parallel write operations typically result in data from a data block being simultaneously written into multiple memory banks. When multiple arrays are simultaneously written to and erased, a single erase count is sufficient for selection of parameters for erase, write, and read operations as the arrays age.

Figure 3:
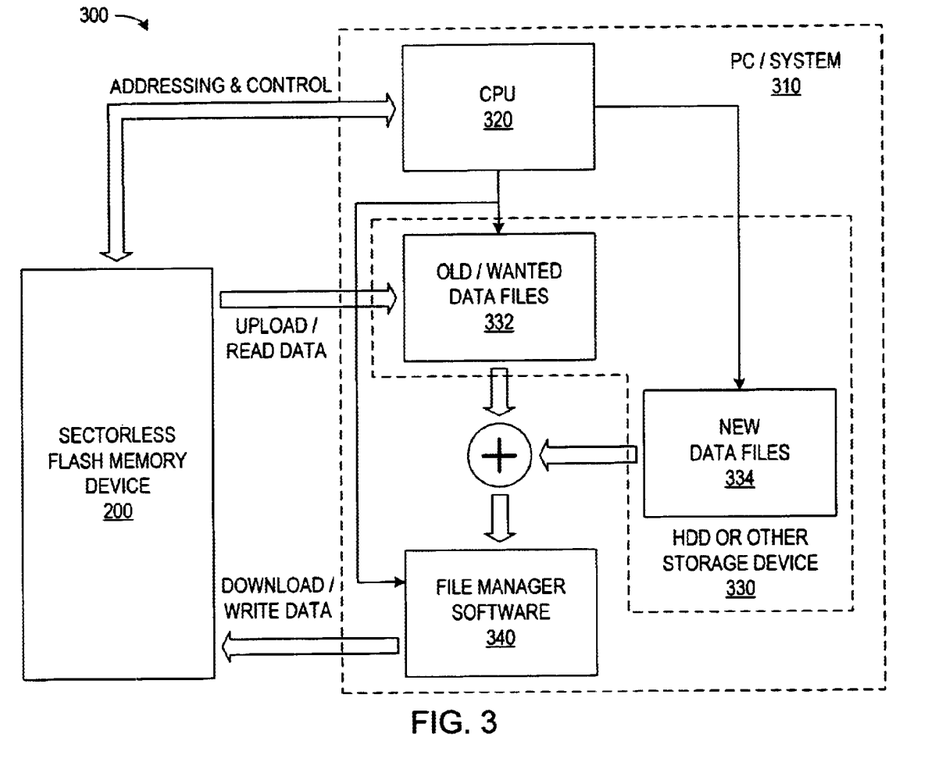
FIG. 3 is a block diagram of a storage system in accordance with an embodiment of the invention.

FIG. 3 is a block diagram of a data storage system 300 in accordance with the invention. The data storage system 300 includes a non-volatile semiconductor memory device 200 such as disclosed in reference to FIG. 2 and a computer system 310. In an exemplary embodiment of data storage system 300, memory device 200 is the memory of a music player that stores a number of songs in a digital format such as MP3 or AC3. When a user decides to change the songs stored in memory device 200, the user connects memory device 200 to computer system 310 using a suitable computer interface or port such as a universal serial bus (USB). The computer system 310 can be any system having a processor (CPU) 320 and a storage device 330 adequate for execution of file management software 340 and storage of data files. In an exemplary embodiment, computer system 310 is a personal computer, and storage device 330 includes the main memory of the personal computer, a hard disk drive, or other media for storage of digital data.

After connecting memory device 200 to computer system 310, the user starts and uses file management software 340 interactively via I/O devices such as the monitor, mouse, and keyboard of computer system 310. In particular, the user selects from the data files in memory device 200, any data files (e.g., songs) that the user wants to delete. File management software 340 then identifies the array or arrays containing data files to be deleted, reads any old data files that are not being deleted, and saves old data files 332 in storage device 330. Alternatively, file management software 340 can read the entire array or arrays, including the data blocks to be erased, and then separate the data to be erased from the data to be saved. As another alternative, the data to be saved can be directly stored elsewhere in memory device 200, for example, in other arrays that have available storage or in an on-chip buffer (not shown).

After the data to be saved has been read from the array, file management software 340 directs memory device 200 to erase each array containing at least a portion of a deleted data file. As noted above, all of the memory cells in an array can be simultaneously erased, or the entire array can be erased a sector at a time. File management software 340 permits the user to select new data files for storage in memory device 200. For example, a user can select an MP3 file from a library in storage device 330 or download a new MP3 file from the Internet into storage device 330. Storage device 330 stores new data files 334 and old data files 332, and the user selects which of the old and new data files to transfer to memory device 200.

When memory device 200 has space available for an old data file 332 and/or a new data file 334 (e.g., after erasing an array), file management software 340 can write one or more data files to the available space. Each data file can be written into the freshly erased array or into other available storage space in memory device 200. The data files can be stored without regard for sector boundaries (if any) in memory device 200. Storage for one data file can start at a physical address immediately following the last address used for another data file. Accordingly, data storage is not wasted by memory cells that remain unused in a last sector storing part of a data file. A directory can record information regarding the data files including, for example, a start address and a file length or stop address for each data file.

For a music player, the time for transferring the content of entire arrays between memory 200 and computer system 310 is relatively insignificant when compared to the time required for other operations involved in the manipulation of music files. For a data rate of 12 Mbits/sec, which is the maximum USB 1.1 data rate, memory 200 requires about 44 seconds to transfer 64 Mbytes of data (the equivalent of one hour of music represented in MP3 format). This data rate can be achieved using multiple banks of memory cells such as illustrated in FIG. 2B. For example, if each array 210 stores four bits per memory cell, the programming or setting of a threshold voltage must be accurate to within about 25 mV, and a worst case write or read time between 1 $\mu$s and 5 $\mu$s can be achieved. Table 1 indicates the effective bandwidth with different numbers of banks operating in parallel and different worst-case write times.

TABLE 1

Effective Write or Read Bandwidth @ 4 Bits/Cell

| Cells Written or Read in Parallel | Write or Read Time to Achieve 25 mV Vt Resolution | | | | |
|---|---|---|---|---|---|
| | 1 $\mu$s | 2 $\mu$s | 3 $\mu$s | 4 $\mu$s | 5 $\mu$s |
| 1 | 4 Mbps | 2 Mbps | 1.3 Mbps | 1 Mbps | 0.8 Mbps |
| 4 | 16 Mbps | 8 Mbps | 5.3 Mbps | 4 Mbps | 3.2 Mbps |
| 8 | 32 Mbps | 16 Mbps | 10.6 Mbps | 8 Mbps | 6.4 Mbps |
| 12 | 48 Mbps | 24 Mbps | 16.0 Mbps | 12 Mbps | 9.6 Mbps |
| 16 | 64 Mbps | 32 Mbps | 21.3 Mbps | 16 Mbps | 12.8 Mbps |
| 24 | 96 Mbps | 48 Mbps | 31.9 Mbps | 24 Mbps | 19.2 Mbps |
| 32 | 128 Mbps | 64 Mbps | 42.6 Mbps | 32 Mbps | 25.6 Mbps |
| 48 | 192 Mbps | 96 Mbps | 63.8 Mbps | 48 Mbps | 38.4 Mbps |
| 64 | 256 Mbps | 128 Mbps | 85.1 Mbps | 64 Mbps | 51.2 Mbps |

For example, with a 2-$\mu$s, worst-case access time and four bits per cell, accessing eight memory cells in parallel proves a 16.0 Mbit/sec bandwidth (which is greater than the maximum USB 1.1 data rate.

Figure 4:
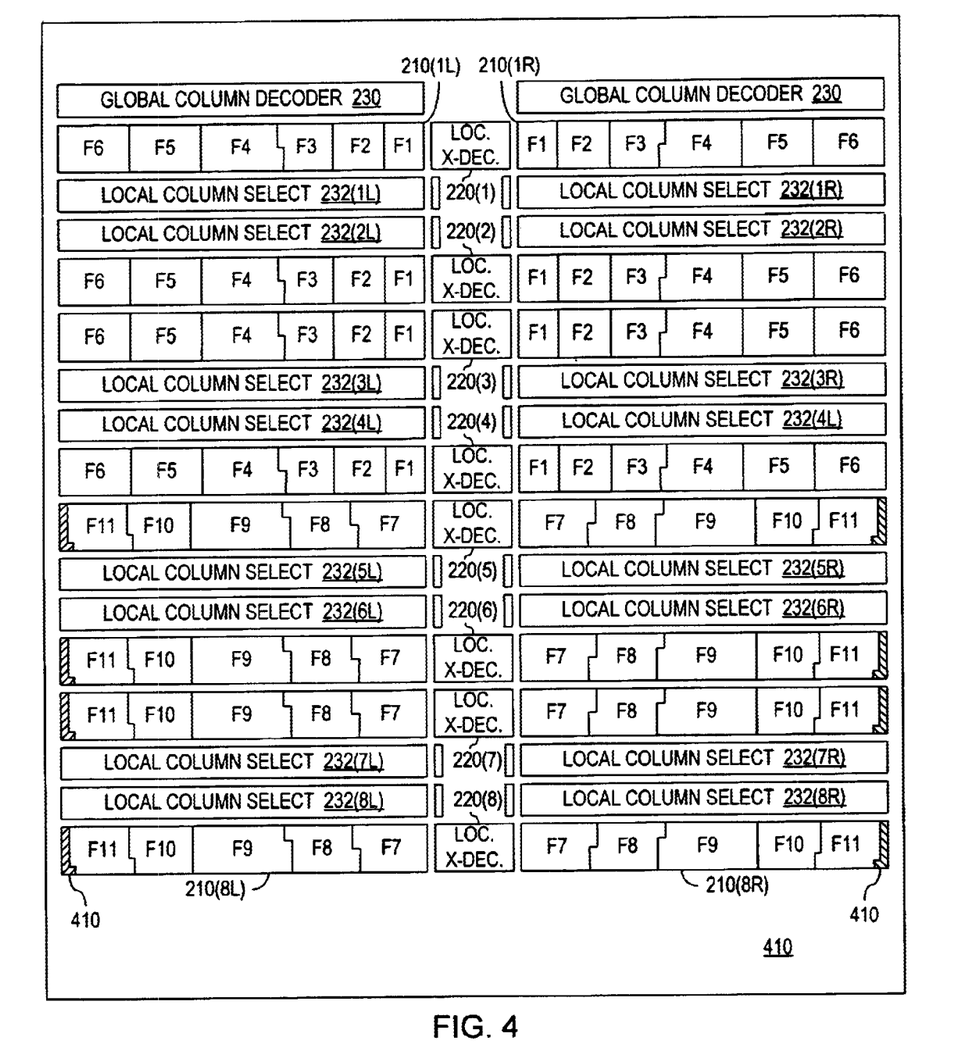
FIG. 4 is a block diagram of a multi-bit-per-cell Flash memory illustrating memory areas storing data files in accordance with an embodiment of the invention.

FIG. 4 shows a layout of a 256-Mbit memory 400 in accordance with a specific example of the architecture illustrated in FIG. 2B. Memory 400 includes eight banks including left arrays 210(1L) to 210(8L) and right arrays 210(1R) to 210(8R). Each of 16 arrays 210(1L) to 210(8L) and 210(1R) to 210(8R) contains 4 Meg cells (4×1024×1024 cells), and each memory cell stores 4-bits of data. In memory 400, an erase operation can simultaneously erase a selected number of arrays or an entire array of memory cells. A write operation simultaneously writes eight 4-bit values (i.e., 32 bits of data) or one memory cell in each of the eight arrays associated with either the first four banks 1 to 4 or the second four banks 5 to 8. Similarly, a read operation simultaneously reads eight 4-bit values (i.e., 32 bits of data) or one memory cell in each of the eight arrays associated with either the first four banks 1 to 4 or the second four banks 5 to 8.

For memory 400, all or the arrays 210 in the four banks are erased together (serially, in pipelined manner, or in parallel), and two erase counts (one for banks 1 to 4 and one for banks 5 to 8) are sufficient to indicate the endurance state of memory 400. Accordingly, variation of erase, program, and read parameters can be on a large scale that requires less overhead than required for known Flash memories.

FIG. 4 further illustrates the allocation of available storage when storing eleven files of different lengths F1 to F11 in memory 400. The first file F1 is stored beginning at an address 0 which is associated with a 32-bit value stored in eight memory cells, one in each of arrays 210(1L) to 210(4L) and 210(1R) to 210(4R). Storage for file F2 begins with an address immediately following the last address used for file F1. Accordingly, there are no unused memory cells between the end of file F1 and the start of file F2. The other files F3 to F11 are stored in the same manner at consecutive addresses so that no unused memory cells are left between files. The boundaries of files are independent of sector boundaries (if any) within arrays 210. The boundaries between files F3 and F4, files F7 and F8, files F8 and F9, and files F10 and F11 particularly illustrate that the end of a file and the start of a next file can be in the middle of a column line. Unused memory cells remain at addresses following the last file F11 but can be used for another file if the file is small enough to fit in the available space.

Figure 5:
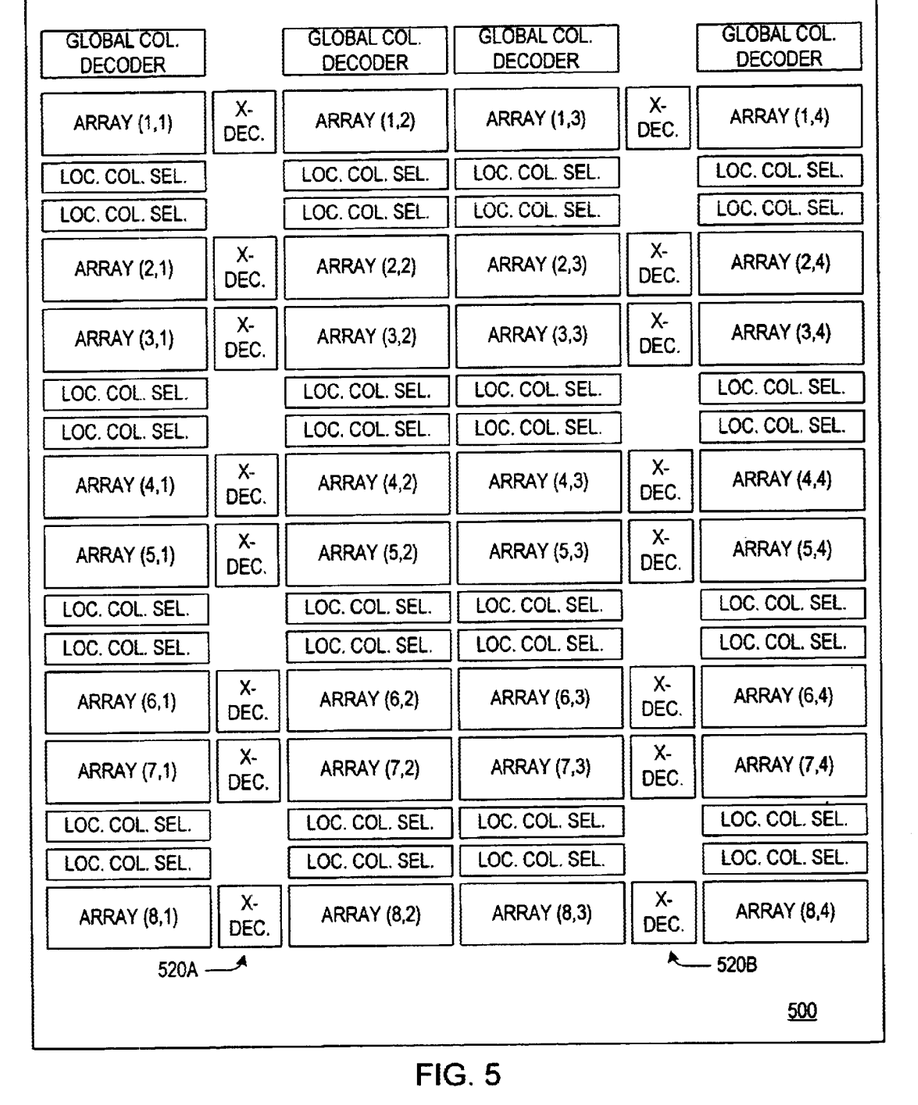
FIG. 5 is a floor plan for specific multi-bit-per-cell memories in accordance with the invention.

FIG. 5 illustrates a layout of a 256-Mbit memory 500 in accordance with an embodiment of the invention including more than one global row decoder 520A and 520B. Memory 500 includes 32 arrays (1,1) through (8,4) arranged in eight rows and four columns. The first two columns of arrays share global row decoder 520A and the second two columns share the second global row decoder 520B. Each array contains 2 Meg cells and stores four bits of data per memory cell. In memory 500, an erase operation can simultaneously erase a selected number of arrays or an entire array of memory cells. A write operation simultaneously writes eight 4-bit values (i.e., 32 bits of data) in the eight arrays associated with two banks of four arrays each. A read operation simultaneously reads eight 4-bit values (i.e., 32 bits of data) in the eight arrays. Memory 500 can implement an endurance enhancement scheme using four erase counts to characterize the endurance state of memory 500.

Although the invention has been described with reference to particular embodiments, the description is only an example of the invention's application and should not be taken as a limitation. In particular, although the above described embodiments concentrated on multi-bit-per-cell memories, the invention can also employ conventional binary memory that store only a single bit in each memory cell. Additionally, the array arrangements in the memories disclosed above are merely examples of possible arrangements. More generally, a memory can employ any number of rows and columns of arrays with suitable global and local circuits. Further, the preceding discussion was aimed at conventional N-channel non-volatile memory devices and described operations and threshold voltages appropriate for N-channel non-volatile memory devices. Alternative embodiments of this invention include other types of device such as P-channel non-volatile memory devices to the extent that those devices are suitable for non-volatile memory. Various other adaptations and combinations of features of the embodiments disclosed are within the scope of the invention as defined by the following claims.

I claim:

1. A non-volatile memory comprising:
   a plurality of arrays of memory cells, each array including row lines, column lines, and a source line, wherein the row lines, the column lines, and the source line of each array are isolated from the row lines, the column lines, and the source line of the other arrays;
   a plurality of local circuits, each local circuit being coupled to a corresponding one of the arrays and implementing erase, write, and read operations in the corresponding array, wherein the erase operation simultaneously erases all memory cells in the corresponding array; and
   global circuits that connect to and coordinate the local circuits for input and output of data from the non-volatile memory.

2. The memory of claim 1, wherein the global circuits coordinate the local circuit to simultaneously write a plurality of multi-bit values in a plurality of the arrays.

3. The memory of claim 1, wherein the global circuits coordinate the local circuit to simultaneously read a plurality of multi-bit values from a plurality of the arrays.

4. The memory of claim 1, wherein the global circuits comprise:
   a global column decoder that selects one or more arrays corresponding to an address signal; and
   a global row decoder that selects and drives row lines in the selected arrays that correspond to the address signal.

5. The memory of claim 1, further comprising:
   non-volatile storage for erase counts; and
   a variable voltage supply that supplies a voltage for access of an array, wherein the voltage supplied depends on an erase count associated with the array.

6. The method of claim 5, wherein the erase counts are in one-to-one correspondence with the arrays, and each erase count indicates how many times the corresponding array has been erased.

7. A method for improving the endurance of a memory that includes a plurality of arrays of non-volatile memory cells, each array including row lines, column lines, and a source line that are isolated from the row lines, the column lines, and the source lines of the other arrays, comprising:
   operating the memory so that an erase operation performed on any one of the arrays erases the entire array;
   maintaining for each of the arrays, a count of erase operations performed on the array; and
   when accessing a non-volatile memory cell in one of the arrays, using a parameter for the access that depends on the count for the array containing the non-volatile.

8. The method of claim 7, wherein the parameter is a voltage used during programming of a non-volatile memory cell.

9. The method of claim 8, wherein the voltage, which depends on the count for the array, is applied to a drain of a memory cell in the array during programming of the memory cell.

10. The method of claim 7, wherein the parameter is a voltage used during erasing of a non-volatile memory cell.

11. The method of claim 7, wherein the parameter is a duration for an erase operation performed on the array.

12. The method of claim 7, wherein the array is isolated to permit write and read operations in the array without affecting any other memory cells in the memory.

13. A system for storage of data blocks, comprising:
   a first memory that is a non-volatile semiconductor memory containing local arrays, each local array having row and column lines that are isolated from the row and column lines of other local arrays;
   a storage device; and
   a processor that executes file management procedure, wherein execution of the file management procedure comprises:
      selecting for erasure one or more data blocks that are at least partly stored in a selected one of the local arrays in the first memory;
      reading from the selected local array data corresponding to one or more data blocks that are not selected for erasure;
      storing in the storage device, the data read from the selected array;
      erasing the selected local array in its entirety; and
      writing the data from the storage device back into the selected local array after the erasing of the selected local array.

14. The system of claim 13, wherein the data blocks are files representing music, and the first memory is a memory in a player of the music.

15. The system of claim 14, wherein the storage device and the process are portions of a personal computer.

16. The system of claim 13, wherein the file management procedure further comprises writing new data into the selected local array after the erasing of the selected local array.

17. The method of claim 13, wherein erasing the selected local array comprises simultaneously erasing all memory cells in the selected local array.

18. The method of claim 13, wherein each of the local arrays is partitioned into a plurality of separately erasable sectors, and erasing the selected local array comprises erasing all of the sectors in the selected local array.

19. The method of claim 18, wherein the sectors in the selected local array are sequentially erased.

20. The method of claim 18, wherein the writing comprises writing data from different data blocks at consecutive addresses in one of the local arrays, without regard for boundaries between the sectors in that local array.

* * * * *